United States Patent [19]

Dufour

[11] Patent Number: 4,711,835

[45] Date of Patent: Dec. 8, 1987

[54] PROCESS FOR PHOTOLITHOGRAPHING A THICK LAYER OF PASTE DEPOSITED ON A SUBSTRATE

[75] Inventor: Michel Dufour, Malesherbes, France

[73] Assignee: Thomson-CSF, Paris, France

[21] Appl. No.: 804,596

[22] Filed: Dec. 4, 1985

[30] Foreign Application Priority Data

Dec. 7, 1984 [FR] France ................................ 84 18776

[51] Int. Cl.⁴ ............................................. H05K 3/02
[52] U.S. Cl. ..................................... 430/314; 427/96; 430/317
[58] Field of Search ................... 427/96; 430/314, 317

[56] References Cited

U.S. PATENT DOCUMENTS

4,119,480 12/1978 Nishi ..................................... 427/96
4,373,019 2/1983 Watanabe ............................ 430/317

FOREIGN PATENT DOCUMENTS

0016231 3/1980 European Pat. Off.
2003983 12/1970 Fed. Rep. of Germany.

OTHER PUBLICATIONS

IEEE Transactions on Components, Hybrids, and Manufacturing Technology, vol. CHMT-2, No. 4, Dec. 1979, pp. 428–433, IEEE, New York, U.S.; Y. Watanabe et al.: "Thick–Film Fine Pattern Formation by a Photolithographic Process".

*Primary Examiner*—John D. Smith
*Attorney, Agent, or Firm*—Oblon, Fisher, Spivak, McClelland, & Maier

[57] ABSTRACT

The invention relates to electric circuits formed by depositing a thick layer of conductive, resistive or dielectric paste on a flat substrate. The thick layers are deposited using a squeegee or by silk screen printing. In this first case, the resolution of the patterns is at best 200 microns, limited by the mesh of the silk screen printing screens. For obtaining finer patterns, the thick layer is dried, then masted using a photoresist, whose patterns may have a resolution of 50 microns, with a space of 50 microns. The thick layer is then etched, in its parts not protected by the photoresist mask, using a mixture of organic solvents which have a differential solubility with respect to the thick layer and to the photoresist.

9 Claims, 5 Drawing Figures

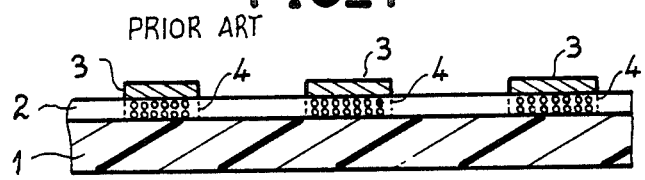
FIG_1 PRIOR ART
FIG_2
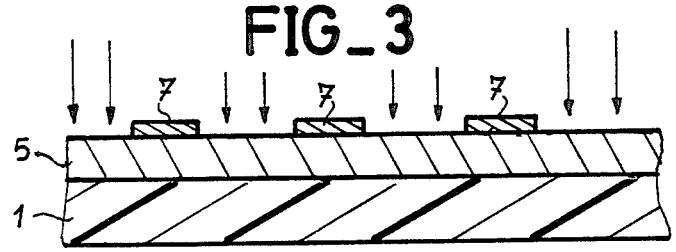
FIG_3
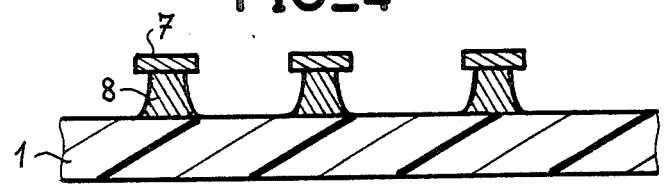
FIG_4
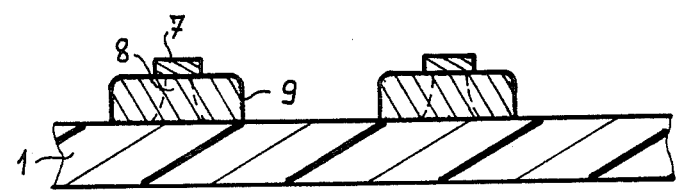
FIG_5

PROCESS FOR PHOTOLITHOGRAPHING A THICK LAYER OF PASTE DEPOSITED ON A SUBSTRATE

BACKGROUND OF THE INVENTION

The present invention relates to a process for lithographing thick layers, deposited on a solid substrate, of paste used in the hybrid circuit industry, for forming networks of very fine patterns and obtaining, by simple methods such as silk screen printing or coating with a squeegee, patterns having lateral dimensions as fine as those obtained by more sophisticated methods such as vacuum evaporation, for thin layers.

Two methods exist for forming networks of patterns on a solid and electrically insulating substrate. One is the method of thin layers which uses vacuum evaporation or cathode spraying of a solid, metal or alloy, the layer of which, from a few nanometers to a few micrometers thick is then chemically etched by a well known photolithographic process. The accuracy obtained, which is that of the photographic masks, is of the order of a micron along a dimension of the pattern parallel to the plane of the mask, but this method requires expensive deposition equipment. The other is the method of thick layers in which a layer of paste, from approximately one to 50 micrometers thick, is either spread with a squeegee or deposited by silk screen printing. The equipment for coating is less costly than the equipment for depositing thin layers, but the accuracy obtained, or more exactly the fineness of the patterns obtained, is limited by the minimum dimension of the mesh of the silk screen and is about 200 micrometers (125 micrometers in certain cases).

OBJECTS OF THE INVENTION

One of the objects of the invention is to provide hybrid, single layer or multilayer circuits in which at least one network of patterns, at the surface of the hybrid circuit is formed as a thick layer but with a fineness of drawing between 10 and 100 microns so that it can be adapted to the most advanced microelectronic components. For example the integrated circuit chips called VLSI comprising up to 200–300 outputs at pitches of 100 microns or chip carriers comprising up to 400 peripheral outputs: in the vicinity of the chip, and so as to be able to connect it to the external network, the thick layer patterns must have dimensions compatible with those of the chip.

Another object of the invention is to allow circuits, more especially hybrid circuits, to be formed in which the conducting and resistive tracks of the network have lengths and spacings therebetween which are coherent with the frequency or, which is tantamount to the same thing, the wave length of the electronic system in operation. Under ultra high frequency conditions more especially it is known that the interconnection circuit must be matched, i.e. of dimensions all the smaller as the frequency increases.

A further object of the invention is to be able to form networks of patterns using commercially available products, namely conductive, resistive or dielectric pastes for the thick layers and positive or negative photoresist resins for the photolithography which require no special preparation.

SUMMARY OF THE INVENTION

In accordance with the invention, a thick layer of paste, formed from solid particles and organic binders, is coated on a rigid and generally insulating substrate such as a ceramic, an alumina or beryllium oxide, using a squeegee or by silk screen printing. If the layer is silk screen printed, it comprises in a first stage a network of patterns whose minimum dimensions are imposed by those of the mesh of the silk screen. This layer is dried then coated with a photoresist layer which is masked by means of a mask reproducing the network of patterns, but with a greater definition.

This means that if a silk screen printed pattern has a width of 200 micrometers because it is difficult to obtain a better definition by silk screen printing, the mask corresponding to this pattern has a precision which is generally of the order of a micron, which is also the precision of photographic masks for the thin layer technique. Exposure of the photoresist to radiation, such as ultra violet radiation, through this mask allows a zone to be defined in the thick layer pattern which will be kept and which is very well defined, and a zone which will be photo etched and eliminated. The photoresist is then developed and the thick layer etched, at the places not protected by the photoresist layer, using an organic solution which has a greater differential solubility with respect to the paste of a thick layer than with respect to the resin of the photoresist. The chemical etching is combined with mechanical sweeping of the solid particles of the paste of the thick layer, for the organic etching solution is sprayed under pressure: with the binder of the paste dissolved, the solid, conductive or resistive or dielectric particles no longer adhere to the substrate and are eliminated. The organic etching solution of the invention has been adapted so that the thick layer of paste is completely etched and the solid particles completely swept before the photoresist layer is dissolved by the same organic etching solution.

More precisely, the invention relates to a process for photolithographing a thick layer of paste deposited on a flat substrate, the paste being formed of solid particles which have an electric function (conductive, resistive or dielectric) or a mechanical protective function and an organic binder, comprising the following operations:

the thick layer is dried at 80°–120° C.,
a photosensitive resin layer is deposited on the thick layer then is exposed to radiation through a high definition photographic mask and developed,
the parts of the thick layer which are not protected by the remaining patterns of the photosensitive resin mask are etched using a mixture of organic solvents, this mixture having a differential solubility with respect to the organic binder of the thick paste layer and with respect to the photosensitive resin, the solubility of the thick layer being greater than the solubility of the photosensitive resin,
the thick layer is baked at 850° C. for sintering it and eliminating the photosensitive resin mask.

BRIEF DESCRIPTION OF THE DRAWINGS

The invention will be better understood from the following detailed description which refers to the accompanying Figures which show:

FIG. 1: a simplified diagram of a photoetching process of the prior art;

FIGS. 2 to 4: a diagram of the photoetching process of the invention, in the case of a thick layer spread with a squeegee;

FIG. 5: a simplified diagram of the photoetching process of the invention in the case of a silk screen printed thick layer.

DESCRIPTION OF THE PRIOR ART

A preliminary reminder of the products used in thick layer hybrid circuits will allow the operations which will be described subsequently to be stated more exactly and the phenomena which occur during these operations to be better explained.

The substrates are generally plates of electric insulating and heat conducting materials such as alumina, beryllium oxide or also enamelled metal sheets. These substrates are made from ceramic, they are baked so as to impart thereto the rigidity required for the operations of forming a network of patterns.

What are called pastes are mixtures of solid particles (metal, ceramic), binders and solvents. The nature of the solid particles which form the essential part of a paste depends on the desired objective. Conducting pastes have a basis of solid gold, silver or gold-platinum particles for example as well as other less rare and less costly but good electricity conducting metals. These conducting pastes are intended to form conducting interconnection tracks. The resistive pastes have a basis of metal and ceramic particles such as silver-palladium and ruthenium oxide, with which resistors are formed. Finally, the so called dielectric pastes have a basis of titanium or zirconium oxide particles, they serve for forming capacitive or isolation zones between two conducting tracks situated in parallel planes of a hybrid circuit. Finally, the protective pastes have a low melting point glass basis and provide essentially mechanical protection. A glass powder added to the solid particles serves as mineral binder, that is to say that when the hybrid circuit has been baked at 850° for sintering the solid particles, the glass which has melted will maintain the cohesion of the solid particles therebetween.

Finally, the binders are resins which give to the solid particle and glass particle mixture a certain fluidity so that the pastes may be spread either with a squeegee or by silk screen printing. The role of these resins is temporary since they disappear during baking of the hybrid circuit. The binders have a basis of methyl cellulose or diethylcellulose, dissolved in organic solvents such as butylcarbitol or butylcarbitol acetate, such a binder composition being universally adopted for thick layer pastes.

These layers are between about four and 35 microns thick after said layer has been dried. They are thick with respect to those which are called thin layers, which are deposited by vacuum evaporation or cathode spraying, and whose thickness is between about 0.01 and 1 micron.

There are two types of etching for the thick layers. A thick layer which has only been dried after coating, at a temperature of about 150° C., is said to be dry etched. That is to say at 150° C. only the solvents of the binder resin are evaporated and that the thick layer has a consistency which is still plastic, since besides the solid and mineral particles, it still comprises a cellulose based resin. A thick layer which after coating has been dried then baked at 850° C., which ensures sintering of the solid particles, is said to be baked etched. At 850° C. the binder has been eliminated and the thick baked layer then comprises only mineral components and no longer an organic part.

The photosensitive resins, or photoresists, used for etching the thick layers are the same as those which are used for etching thin layers. They are of two types: the positive resins for which the exposed parts becomes soluble in the solvent considered and the negative resins, whose parts subjected to the ultra violet rays become insoluble in some solvents.

The resins are in the liquid state and sometimes, for the negative resins, in the solid state in the form of a film. These are solutions of orthoquinone-diazide esters and prepolymerized phenol-formaldehyde carboxymethyl-esters. They are initially soluble in the organic solvents and become insoluble after exposure to the ultra violet rays. This change of solubility depends solely on the photochemical decomposition of the orthoquinonediazide, followed by a transformation and hydrolysis which gives carboxylic acid. The maximum sensitivity for photosensitive resins is between 3000 and 4500 angstroms. The photosensitive resins are in solution in products such as butylcellosolve, xylene, glycol.

The photoresists are deposited on the free surface of the thick layer either by centrifugation, or by spraying, or by other processes such as immersion. Before being exposed to the ultra violet rays through a mask, the photoresists are dried by hot air blowing, in a ventilated drying oven for example at a temperature which varies between 40° and 80° C. depending on the product.

Finally by pattern network is meant networks of conducting tracks, resistive or capacitive zones, or else soldering and connection studs. In order to be suitable for the very advanced integration techniques of the VLSI kind, these pattern networks must be of very high definition. By fineness of a network should be understood the definition of its dimensions in a plane parallel to the plane of the substrate; for example a pattern is said to be 50 microns-50 microns if the width of the pattern is 50 microns and if the space separating it from the adjacent pattern is also of 50 microns. The fineness of a pattern network defines its dimensions in a horizontal plane but the thickness of the thick layer does not come into consideration in the present case.

The formation of a high definition thick layer network is a major problem at the present time for matching VLSI chips to external circuits, without adversely affecting the qualities and characteristics of the VLSI by an interconnection network which is not matched. The object of the invention is therefore to obtain line definitions of 50 microns using a dry photolithographic process, that is to say that the silk screen print paste is only dried at about 150° C. Such a technological process must ally the low cost of silk screen printing with the definition obtained with thin layers, in so far as conductors, resistors and insulators are concerned. Consequently, the process of the invention consists in etching and obtaining a pattern defined by a photolithographic mask from layers deposited by the thick layer method either with a squeegee or by silk screen printing.

A method for obtaining fine networks of patterns in the form of thick layers is described in the European patent application No. 0016231 and illustrated by FIG. 1.

In this method, on a substrate 1 is spread a thick layer of paste 2, then a photoresist film 3. The photoresist is then printed through a mask, which gives the patterns in the state in which they are shown in FIG. 1. The thick paste layer 2 is then removed by chemical means, which gives a substantially conventional process with respect to the known art.

The whole originality of the method described in the cited document resides in the fact that one of the two layers, for example the photoresist layer, is soluble in water whereas the other layer, for example the thick layer, is soluble in organic solvents which means that dissolution by an organic solvent of the unmasked thick layer does not cause dissolution of the photoresist layer, in these patterns 3. When the thick layer 2 has been etched and when patterns 4 have been formed therein whose definition is as fine as that of the patterns 3 of the photoresist, the circuit is then baked at temperatures of the order of 850° C. which cures the patterns 4 and eliminates the photoresist patterns 3 during baking.

In this process, the photoresist film 3 does not include organic agents and has a polyvinyl alcohol basis. It is a negative type photoresist which was specially prepared by the inventors for photoetching thick layers. However a photoresist containing organic agents may be used with certain pastes provided that the interaction between the photoresist, the development product and the thick layer is negligible. A drawback of the method is therefore that of requiring in the majority of cases the preparation either of a special photoresist soluble in water if the paste is of an organic type, or the preparation of a special paste soluble in water if the photoresist is organic and comprises solvents usual in this type of activity.

It is therefore an object of the invention to provide a process which does not require the use of photoresists or pastes specially prepared for this purpose.

DESCRIPTION OF THE INVENTION

According to the process of the invention a thick layer of paste 5 is deposited on a substrate 1. The thickness of this layer is generally between 4 and 15 microns, but it may reach thicknesses up to 35 microns after drying. The thick layer is effectively dried at a temperature varying between 80° and 120° C. in ventilated drying oven, the temperature being chosen depending on the conductive, resistive, dielectric or insulating nature of the paste and depending on the solvents which are added to it during manufacture.

On the thick layer, whose external surface is flat and has sufficient hardness, is deposited a layer of photoresist 6. The surface of the thick layer 5 must have an adequate hardness so that the solvents introduced in the photoresist mixture do not penetrate into the thick layer 5. The thickness of the photoresist deposit is of the order of 0.5 to 2 microns, or slightly more depending on the inks used for the thick layer. It is not possible and not useful to deposit a thicker layer for when the hybrid circuit is baked, right at the end of the operations, the photoresist is eliminated, but before being evaporated at 850° C. it retracts and causes peeling of the thick layer, despite low temperature rise rates, so as not to exert any force between the photoresist layer and the thick layer. Measurements have shown that centrifugation deposition of the photoresist, i.e. of deposits of a thickness of the order of 0.5 to 1 micron, does not cause peeling of the thick layer.

The next operation, illustrated in FIG. 3, consists in exposing and developing the photoresist mask. The photoresist layer 6 is exposed through an appropriate mask, using a radiation whose wave length must correspond to the maximum spectral sensitivity zone of the photoresist, i.e. between 3000 and 4500 angstroms, by means of an appropriate exposure source such as an arc lamp, a mercury vapor lamp, a pulsed xenon lamp or a black light tube. But in addition, so as to obtain high definition, it is necessary to have a source with parallel rays. The chassis must also be cooled so as to avoid any dimensional variation of the exposure mask, blistering of the photoresist or possible annealing during exposure.

The development of the photoresist mask, which allows only the patterns 7 of layer 6 to be kept, may takeplace by immersion in a still bath, with agitation on the substrates, or by spraying of solvents, but spraying gives better results in so far as the definition of the patterns formed is concerned. The solvent is the normal solvent for the photoresist and is often delivered by the supplier of the photoresist. The temperature during development must be held constant within a few degrees, for it has a great influence on the development speed. The development is followed by abundant rinsing so as to remove all the organic parts coming from the photoresist, which might then adversely affect the fineness of the thin layer pattern network.

Finally, the photoresist mask is baked: although this operation is not indispensable, it takes place at a temperature of the order of the drying temperature, i.e. from 80° to 120° C. and it improves the resistance of the resin with respect to the agents used for etching the thick layer.

The dry photolithographic operation properly speaking is the following operation. Chemical etching may be carried out in a still bath or by spraying at ambient temperature or in a hot bath, i.e. 30° to 40° C., but the best results are obtained by spraying.

It takes place directly at the unprotected places and is shown symbolically by arrows in FIG. 3. Chemical etching may be carried out on a single face or on both faces if the hydrid circuit is double faced. It takes place progressively by forming lateral etching, i.e. beginning of etching under the protective resin, and the magnitude of such lateral etching varies depending on the nature of the material, the etching solution and the etching conditions. Lateral etching is generally equal to half the thickness to be etched, but it is possible to make a compensation in the design of the exposure mask so as to take into account the approximative value of the lateral etching.

The etching agent is a mixture of two products which has been specially designed for use with the invention, the mixture of these two products being easier to carry out industrially than the preparation either of a special photoresist or of a special ink for the thick layers. This mixture contains trichloroethane frequently called chlorotheme, which is a solvent which attacks the organic binders of the inks. But this solvent is too aggressive and has an action which is too rapid, which is why a product is added thereto which plays the role of etching and evaporation moderator. In fact, it is difficult to carry out precise operations if the chemical etching of the thick layer takes place too rapidly: a latitude of the order of 5 to 10 seconds in the etching time must be obtained, which is itself the order of 10 seconds without the moderator. Whence the necessity of adding a moderator to the trichlorethane so as to attain etching times which are between 50 and 80 seconds.

Among the different moderators tested, the butylcarbitol or monobutylic ether of diethylene glycol, the monobutylic ether of ethylene glycol or the monobutylic ether of ethylene glycol acetate are those which have given the most interesting results. Butyl acetate, xylene and terpineol, mixed with trichloroethane, also give a thick layer etching solution which is efficient, but the best results were obtained with a mixture comprising 70% trichloroethane and 30% butyl carbitol. The results are judged on the cleanliness of the work piece, i.e. the elimination of the residual solid particles of the thick layer, on the appearance of the thick layer and on the appearance of the dry etching and after baking. In fact, a work piece may be properly cleaned, have a good dry etching definition, and after baking present a mediocre appearance because the ink of a thick layer is more or less impregnated with solvent, which escaped from the thick layer during baking. The solution for etching the thick layer is sprayed at a pressure between 5 and 25 kg per cm² and at an angle between 0° to 30° with respect to the plane of the substrate, so as to provide mechanical sweeping of the solid particles of the ink of the thick layer. The result is better if the spraying is made at a certain angle, close to 30° and at a constant temperature, so that, during the different etchings of a manufacturing batch, the etching time also remains constant.

A piece obtained after etching of the thick layer is shown in section in FIG. 4. Of the thick layer of ink 5 originally deposited there only remain fine patterns 8 each topped by a photoresist mask 7. The next operation consists then in drying, for 15 minutes at 80° C. in a ventilator drying oven, the hybrid circuit comprising a network of fine patterns but which are still in the dry state, that is to say that the thick layer still comprises organic parts in these patterns 8 and is not yet baked. The baking, which therefore gives a hard useable pattern on which components, may be mounted or soldered takes place at 850° C.

FIG. 5 sums up a variant of FIGS. 2 to 4 and shows the case where the thick layer 9 is deposited partially on the substrate by silk screen printing. It has been said that it is difficult to obtain patterns whose dimensions are less than 200 microns by silk screen printing. By depositing a photoresist mask on such a silk screen printed network then exposing the photoresist and etching the thick layer 9, patterns 8 are obtained, shown with broken lines whose minimum dimensions are between about 10 and 100 microns depending on the nature of the ink of the thick layer. Thus, it is easier to form fine patterns with conducting ink rather than with a dielectric or protective ink, the patterns of resistances being of an intermediate fineness. By way of example conductive patterns of 50 microns - space 50 microns, resistive patterns of 60 microns - space 60 microns, and dielectric or protective patterns of 100 microns along the side are currently formed.

These results shown that dry photography allows conductive or resistive networks to be formed on a substrate of large size, with a resolution greater than the resolution obtained by the silk screen printing process. The precision of the patterns obtained is equal to the precision of the masks for photomasking the photosensitive resin. This etching technique applies either to single layer substrates, or to multilayer substrates; in this case, at least the network forming the upper layer is etched with a high definition in accordance with the process of the invention whereas, if that is necessary or possible, the intermediate levels of the multilayers are simply silk screen printed. The process for photoetching these layers in accordance with the invention, which has the advantage of requiring the preparation only of a mixture of organic solvents acting on the differential solubility of the two layers of photoresists and ink in thick layer form thus allows a minimum width of the conductive and resistive networks to be obtained, with a maximum density of lines per millimeter for the conductors and resistances. Because of the accuracy of the etching and the profile of the etched lines the connecting holes in the insulating layers may have minimum dimensions, in the case of multilayer circuits. The process is simple to use and only requires readily available products, with a good yield which makes it industrial.

It is essentially used for forming single layer and multilayer hybrid circuits intended to receive highly integrated electronic systems of the VLSI integrated circuit type.

What is claimed is:

1. A process for photolithographing a thick layer of paste deposited on a flat substrate, the paste being formed of solid particles which have an electric function (conductive, resistive, dielectric) or a mechanical protective function, and an organic binder, comprising the following operations:
   (1) the thick layer is dried at 80°–120° C.,
   (2) a layer of photosensitive resin is deposited on the thick layer, and then is exposed to ultraviolet radiation through a high definition photographic mask and developed,
   (3) the parts of the thick layer which are not protected by the remaining patterns of the photosensitive resin mask are chemically dissolved using a mixture of organic solvents, said mixture of organic solvents having a differential solubility with respect to the organic binder of the thick paste layer and with respect to the photosensitive resin, the solubility of the thick layer being greater than the solubility of the photosensitive resin, said chemical dissolution of the organic binder of the thick layer being accompanied by mechanical sweeping of the solid particles, the mixture of solvents being sprayed on the thick layer at a pressure between 5 and 25 kg/cm² and at an angle between 0° to 30° with respect to the plane of the substrate,
   (4) the thick layer is baked at 850° C. for sintering it and eliminating the photosensitive resin mask.

2. The process for photolithographing a thick layer as claimed in claim 1, wherein the mixture of solvents comprises a solvent which is aggressive with respect to the organic binder of the thick paste layer and a moderating solvent which allows the duration of the operation for etching the thick layer to be adjusted.

3. The process for photolithographing a thick layer as claimed in claim 2, wherein said aggressive solvent is 1,1,1-trichlorethane.

4. The process for photolithographing a thick layer as claimed in claim 2, wherein the moderating solvent is chosen from: diethylene glycol monobutylic ether, ethylene glycol monobutylic ether, ethylene glycol acetate monobutylic ether, butyl acetate, xylene, and terpineol.

5. The process for photolithographing a thick layer as claimed in claim 2, wherein the mixture of solvents comprises 70% by volume trichlorethane and 30% by volume of diethylene glycol monobutylene ether.

6. The process for photolithographing a thick layer as claimed in claim 1, wherein the thick layer of paste is deposited on the substrate using a squeegee, in a continuous layer, with a thickness between 5 and 35 microns (after drying).

7. The process for photolithographing a thick layer as claimed in claim 1, wherein the thick layer of paste is deposited on the substrate by partial or total silk screen printing in patterns of minimum dimensions of the order of 200 microns, with a thickness between 5 and 35 microns (after drying).

8. The process for photolithographing a thick layer as claimed in claim 1, wherein the patterns of the photosensitive resin mask have minimum dimensions of the order of:
- 50 microns, - space 50 microns, for the conductive layers,
- 60 microns, - space 60 microns, for the resistive layers,
- 100 microns, - space 100 microns, for the dielectric and mechanical protective layers,
- 100 microns along each side for the windows ensuring the connection after filling with conductive ink, between two conductive levels situated in two parallel planes and separated by about 40 microns of dielectric.

9. The process for photolithographing a thick layer as claimed in claim 1, wherein the mixture of solvents is sprayed on the thick layer at an angle close to 30°.

* * * * *